United States Patent [19]
Kosmin

[11] 3,938,021
[45] Feb. 10, 1976

[54] BATTERY CHARGING CIRCUIT WITH FULL-CHARGE CUTOFF

[75] Inventor: Melvyn S. Kosmin, Ocean Township, N.J.

[73] Assignee: The United States of America as represented by the Secretary of the Army, Washington, D.C.

[22] Filed: Aug. 15, 1974

[21] Appl. No.: 497,773

[52] U.S. Cl. .................................. 320/40; 320/54
[51] Int. Cl.² .......................................... H02J 7/04
[58] Field of Search ............ 320/39, 40, 31, 20, 11, 320/54

[56] References Cited
UNITED STATES PATENTS 3,289,065 11/1966 Dehmelt et al. ...................... 320/40
3,794,905 2/1974 Long .................................... 320/20

OTHER PUBLICATIONS

Jakobi, Wm. W., *Alkaline Secondary Cells*, Gould National Batteries, Inc. (reprinted from *Encyclopedia of Chemical Technology*, 2nd Edition, Vol. 3) pp. 204, 207.

Primary Examiner—J. D. Miller
Assistant Examiner—Robert J. Hickey
Attorney, Agent, or Firm—Nathan Edelberg; Robert P. Gibson; Arthur L. Bowers

[57] ABSTRACT

A battery charging circuit which monitors the terminal voltage of the battery being charged and when the terminal voltage drops off, which occurs at full charge, the circuit operates to terminate the charging.

1 Claim, 4 Drawing Figures

BATTERY CHARGING CIRCUIT WITH FULL-CHARGE CUTOFF

BACKGROUND OF THE INVENTION

A rechargeable battery is damaged or ruined by charging past full charge at other than a trickle charge rate. The problem has become more acute since rapid recharge has come into use. For example, in place of 10 hour rate charging for sealed batteries (e.g., nickel-cadmium), new high rate recharge techniques of one hour or less are under investigation and may come into wide use by government and industry. The exothermic reaction in a battery being charged beyond full charge, particularly at high rate recharge can result in an explosion. An inefficient method of avoiding overcharging is for the technician to estimate the degree of battery discharge and then to decide on a safe charging period so as to terminate the charging with a conservative margin of safety, that is, substantially before the battery is fully charged.

SUMMARY OF THE INVENTION

This invention makes use of the terminal voltage $v$. time characteristic of a rechargeable battery. If the battery is nearly completely discharged when it is first connected to a charging source, the terminal voltage of the battery rises comparatively steeply for a short period of time and then bends sharply to exhibit a monatonically increasing voltage characteristic, that is, a positive gradual slope, under a constant current charge, until full charge. At full charge, the terminal voltage rises briefly and then falls back. This invention detects the inflection point at the peak of the voltage curve to terminate the charging. A capacitor is charged through a diode. The forward voltage across the diode is continuously monitored and up until full charge there is current through the diode into the capacitor and the voltage drop across the diode is about 0.7 volts. After the inflection point the voltage across the diode decreases, and this voltage change is used to terminate the charging of the battery.

An object of this invention is to fully charge a rechargeable battery at a substantially constant current rate without overcharging the battery.

DESCRIPTION OF A PREFERRED EMBODIMENT

Figure 1:
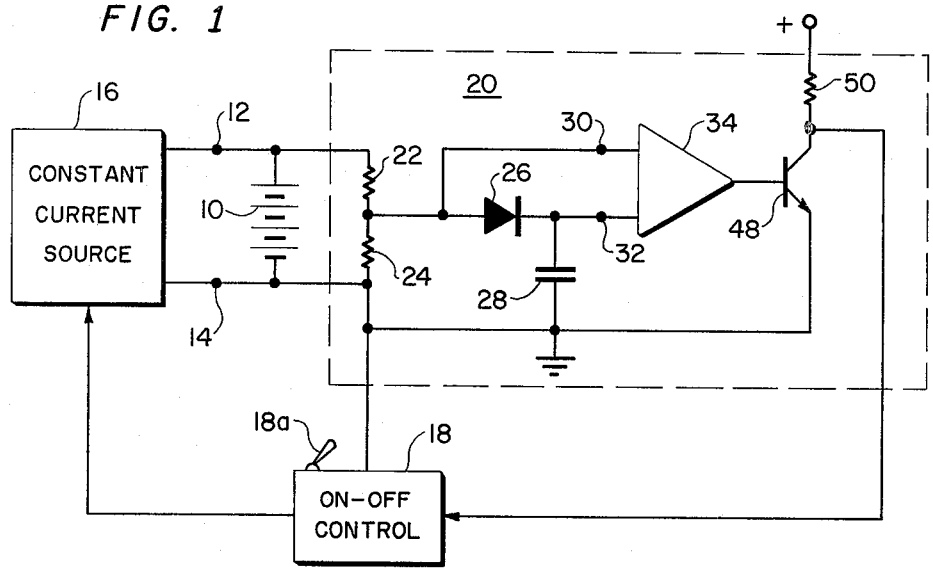
FIG. 1 is a circuit diagram of a preferred embodiment of the invention.

In the embodiment shown in FIG. 1, a battery 10 is connected to the output terminals 12 and 14 of a conventional, selectively-adjustable, constant-current source 16. An on-off control 18 is connected to the current source and includes a manual switch 18a to turn on or turn off the charging current to the battery. Additionally the control includes an electronic or electromechanical relay responsive to a positive voltage step from full-charge detection means 20 to terminate the charging of the battery when it is fully charged.

Figure 2:
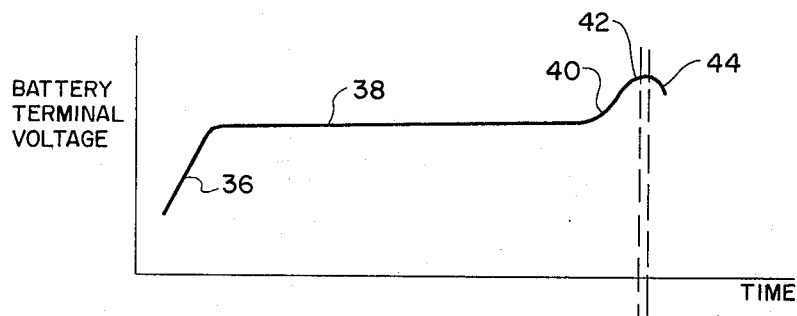
FIG. 2 is a plot of terminal voltage $v$. time during recharge of a near fully discharged rechargeable battery.
Figure 3:
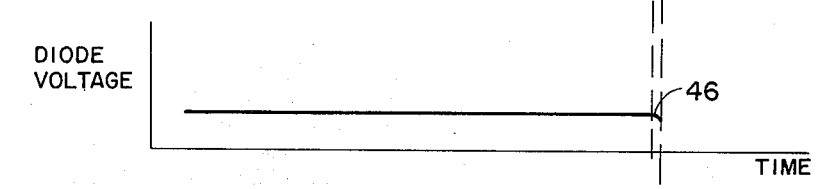
FIG. 3 is a plot of voltage across the diode shown in FIG. 1 over the charging period.
Figure 4:
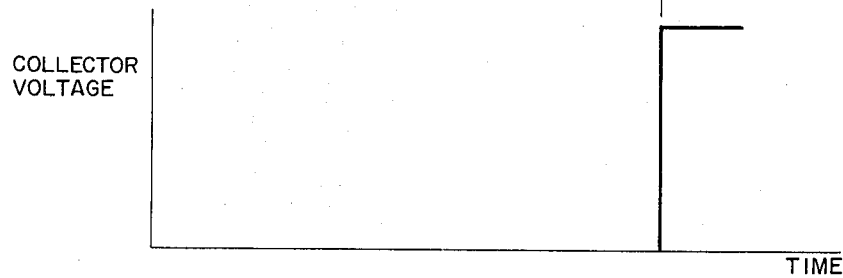
FIG. 4 is a plot of collector voltage $v$. time of the transistor shown in FIG. 1 over the charging period.

The full-charge detection means 20 includes a voltage divider including resistors 22, 24 connected across the battery 10. The voltage divider may be omitted if the battery to be charged is of low voltage, e.g., 3 volts. A diode 26 and a capacitor 28 are connected in series across the resistor 24. The diode 26 is connected in the forward direction. The input terminals 30, 32 of a very high input impedance amplifier 34 are connected to the anode and cathode ends of diode 26. The amplifier output changes in the same direction as the input voltage to the amplifier. It may have unity gain or higher gain depending upon the rate of response desired. There is about 0.7 volts forward voltage drop across the diode when the diode conducts and the capacitor charges. The capacitor voltage is equal to the voltage across resistor 24 less 0.7 volts. FIG. 2 shows the voltage-time characteristic of a rechargeable battery for constant current. The diode 26 conducts during the steeply rising initial portion 36 and the gradual positively sloping portion 38, and the voltage rise at full charge. At the inflection point 42 of the peak of the curve the diode ceases to conduct but the capacitor retains the peak voltage because of the high input impedance of the amplifier and the high reverse-resistance of the diode. A switch-operated capacitor discharge shunt is included but not shown in FIG. 1. As the voltage decreases at 44, the voltage across the diode drops as shown at 46 in FIG. 3. The base of an NPN transistor 48 is connected to the output of amplifier 34; a resistor 50 connects the collector to a dc source and a conductor connects the collector to the on-off control 18 to operate the relay therein when the collector voltage rises abruptly from near zero to the supply voltage as is shown in FIG. 4, in response to a small decrease in voltage across the diode. The transistor is biased such that a 0.7 volt base signal saturates the transistor. A switching network may be substituted for the transistor 48.

What is claimed is:

1. A battery charging circuit including overcharge protection for a battery being charged comprising:
a constant current source having a pair of output terminals,
a resistive voltage divider connected across the output terminals of the current source,
a series connected diode and capacitor connected across a resistor of the voltage divider with the diode in the forward direction to follow changes in the terminal voltage of a battery connected across the current source and being charged,
a high input impedance amplifier having a pair of input terminals connected across the diode,
a transistor amplifier including a collector resistor, the base of the transistor amplifier being connected to the output of the high input impedance amplifier to operate at saturation when the diode conducts, and to reduce current level abruptly when the diode ceases to conduct, and
on-off control means connected between the collector of the transistor amplifier and the constant current source for turning off the constant current source when the current level in the transistor amplifier is reduced abruptly.

* * * * *